United States Patent [19]

Nussbaumer

[11] 4,062,060
[45] Dec. 6, 1977

[54] DIGITAL FILTER

[75] Inventor: Henri J. Nussbaumer, LaGaude, France

[73] Assignee: International Business Machines Corporation, Armonk, N.Y.

[21] Appl. No.: 737,631

[22] Filed: Nov. 1, 1976

[30] Foreign Application Priority Data

Nov. 10, 1975   France .................................. 75.35235

[51] Int. Cl.$^2$ ............................................. G06F 15/34
[52] U.S. Cl. ................................... 364/724; 328/167; 333/18; 364/725
[58] Field of Search ................ 235/152, 156; 328/167; 333/18, 28 R, 70 T

[56] References Cited

U.S. PATENT DOCUMENTS 3,906,218   9/1975   Nussbaumer .......................... 235/156
3,980,873   9/1976   Mattei .................................. 235/156

OTHER PUBLICATIONS

C. M. Rader, "Discrete Convolutions Via Mersenne Transforms", *IEEE Trans. on Computers*, vol. C-21, No. 12, Dec., 1972, pp. 1269-1273.

*Primary Examiner*—Jerry Smith
*Attorney, Agent, or Firm*—Delbert C. Thomas

[57] ABSTRACT

The invention covers a precision digital filter for signal samples represented in a digital form. The flow of samples $x_o, x_1, x_2, \ldots x_m$ of the signal is split into blocks of a fixed length which are simultaneously transmitted to two circular convolution generators operating to different prime number modulos. The outputs of the generators are each submitted to a correcting device and the corresponding corrected terms are added. The added terms are each then added to a delayed prior term to generate representations of samples of a filtered signal.

7 Claims, 9 Drawing Figures

| FIG. 5A | FIG. 5B |
|---|---|

FIG. 6

DIGITAL FILTER

This invention relates to the field of digital filtering and, more particularly, to methods by which it is possible to minimize the number of operations needed for the implementation of such filtering.

The filtering of a signal $x(t)$ by means of a filter having an impulse response of $h(t)$ results from the so-called aperiodic convolution operation between these two factors which convolution can be written $y(t) = h(t) \times x(t)$, where $y(t)$ is the filtered signal.

When processing samples of a signal, the filtered output signals of the above operation become:

$$y_N = \sum_{i=0}^{p-1} h_i \cdot x_{N-1} \quad (1)$$

where $y_N$ is the Nth sample of the filtered signal, $h_i$ with $i=0, 1, 2, \ldots, p-1$, the filter coefficients which result from sampling of h(t), and $X_{N-i}$ the $N-i$ sample of the signal to be filtered.

With reference to formula (1), it appears that the determination of each sample of the filtered signal will require the execution of $p$ multiplications and $p-1$ additions. Now the multiplier is a relatively costly device and the multiplication operation is relatively lengthy. Therefore, the greater the number of multiplications to be performed to determine a sample $y_N$, the slower will be the filter. Also, if we keep in mind the fact that the frequency at which the samples $x_N$ appear at the filter input must be at least twice as high as the highest frequency of the spectrum of signal $x(t)$, it is easy to understand that a slow filtering operation substantially limits the filter which is embodied in such a filtering process and, more particularly so, when it is desirable to process a signal in real time.

It has, therefore, been necessary to find solutions to remedy the above-mentioned drawbacks and numerous solutions have been proposed. It has been suggested that use be made of the properties of some mathematical transforms and, more specifically, of the discrete Fourier transforms (DFT). The advantage of such transforms is that they verify the so-called convolution theorem. In other words, if $[H_K]$ and $[X_K]$ are indicative of the transforms of sets $[h_i]$ and $[x_i]$, having p terms each, and if $P_K$ is indicative of the terms resulting from the multiplication, i.e., $P_K = H_K \cdot X_K$, it can be shown that the inverse transform of set $[P_K]$ supplies the terms resulting frm the convolution of the set of terms $[h_i]$ with the set of terms $[x_i]$ and, therefore, the samples $Y_N$ of the required filtered signal are easily obtained.

Now, both direct and inverse transforms can be carried out with simple operations. More particularly, when Mersenne or Fermat transforms are concerned, the multiplications needed to be performed are only those intended to supply the terms $P_K$ from $H_K$ and $X_K$. The number of multiplications required is reduced by a factor $p$. The drawback is that there is a close relationship between the length $p$ of the transform and the size of the words which can be processed. Some applications require a high precision of both filter coefficients and signal samples, and thus, words which are a digital representation thereof, must be relatively long (30 bits, for example). It results, therefore, that the number of the terms in the transforms must be high. Their processing times will be relatively long and, again, we will have some of the above-mentioned drawbacks, which is a limitation to the field of application of such signal processing methods.

A French patent application filed by the applicant in France on Apr. 16, 1975, under number 75 12557 and corresponding to my U.S. patent application Ser. No. 670,325, filed Mar. 25, 1976, discloses a convolution to reduce the time-length of the process by dividing the lengths of the transforms to be actually performed, by four. But this is still not sufficient for some digital filtering applications. Also, in a few cases, the physical embodiment of such digital filtering is too bulky.

Therefore, the object of this invention is to provide a digital filtering device which can increase the precision of the processed terms without adversely affecting the required computing power.

This invention will be further described, by way of a non-limiting example, with reference to the accompanying drawings, in which.

Generally stated, the use of discrete transforms leads to the execution of periodic convolutions (the so-called circular convolutions), whereas the filtering operation results from an aperiodic convolution. Messrs. B. Gold and C. M. Rader disclose in their book entitled "Digital Processing of Signals" (Chapter 7), published in 1969 by McGraw Hill and having a Library of Congress Catalog No. 69-13606 that it is possible to convert periodic convolutions into an aperiodic convolution by splitting the flow of samples of the signal to be filtered into blocks of samples, proceeding to circular convolutions upon said blocks, and then, combining the results. More specifically, they define two processing methods, namely the "overlap-add" method and the "overlap-save" method. The differences between the two methods is the way the data blocks which are submitted to the discrete transform, are composed before their being submitted to circular convolutions and on the way the results of these convolutions are combined.

The following examples illustrate these two methods. Let us suppose that a signal whose samples are referred to as $x_o, x_1, x_2, x_3, \ldots$, is submitted to a filtering operation with three coefficients, $h_o, h_1, h_2$. Whatever be the chosen method, a sequence of zeros should be appended to the coefficients in order to obtain a set, say $[b_n] = [h_o, h_1, h_2, 0, 0]$. Now, suppose that we wish to make use of the "overlapadd" method. The flow of data should be split into groups of three consecutive samples and two zero terms be appended in order to form a set $[a_n]$. Then, circular convolutions will be executed between the successive sets of $[a_n]$ and $[b_n]$ and the results will be added. For instance: (1)

First circular convolution
Data Blocks $[a_n]$ $[x_0, x_1, x_2, 0, 0]$.
Coefficient blocks $[b_n]$ $[h_0, h_1, h_2, 0, 0]$.

$z_0 = \overline{h_0 x_0 + h_1 0 + h_2 0 + 0 x_2 + 0 x_1} = h_0 x_0$ $z_1 = \overline{h_0 x_1 + h_1 x_0 + h_2 0 + 0 0 + 0 x_2} = h_0 x_1 + h_1 x_0$ -continued $z_2 = h_0 x_2 + h_1 x_1 + h_2 x_0 + 0\ 0 + 0\ 0 = h_0 x_2 + h_1 x_1 + h_2 x_0$ $z_3 = h_0 0 + h_1 x_2 + h_2 x_1 + 0 x_0 + 0\ 0 = h_1 x_2 + h_2 x_1$ $z_4 = h_0 0 + h_1 0 + h_2 x_2 + 0 x_1 + 0 x_0 = h_2 x_2$ (2) Second convolution
$[a_n]\ [x_3, x_4, x_5, 0, 0]$
$[b_n]\ [h_0, h_1, h_2, 0, 0]$ $z_5 = h_0 x_3 + h_1 0 + h_2 0 + 0 x_5 + 0 x_4 = h_0 x_3$ $z_6 = h_0 x_4 + h_1 x_3 + h_2 0 + 0\ 0 + 0 x_5 = h_0 x_4 + h_1 x_3$ $z_7 = h_0 x_5 + h_1 x_4 + h_2 x_3 + 0\ 0 + 0\ 0 = h_0 x_5 + h_1 x_4 + h_2 x_3$ $z_8 = h_0 0 + h_1 x_5 + h_2 x_4 + 0 x_3 + 0\ 0 = h_1 x_5 + h_2 x_4$ $z_9 = h_0 0 + h_1 0 + h_2 x_5 + 0 x_4 + 0 x_3 = h_2 x_5$ (3) The combinations to be made are
$y_2 = z_2 = h_0 x_2 + h_1 x_1 + h_2 x_0$
$y_3 = z_3 + z_5 = h_0 x_3 + h_1 x_2 + h_2 x_1$
$y_4 = z_4 + z_6 = h_0 x_4 + h_1 x_3 + h_2 x_2$
$y_5 = z_7 = h_0 x_5 + h_1 x_4 + h_2 x_3$ Thus, samples $y_n$ of the filtered signal are obtained by adding the results of the circular convolutions executed upon consecutive input data blocks after submitting them to an appropriate delay.

The "overlap-save" method is slightly different with respect to the splitting of the data flow and the combinations of the results. (In order to keep the same notations as above, the sample before $x_0$ will be referred to as $x_{-1}$).

Figure 1A:
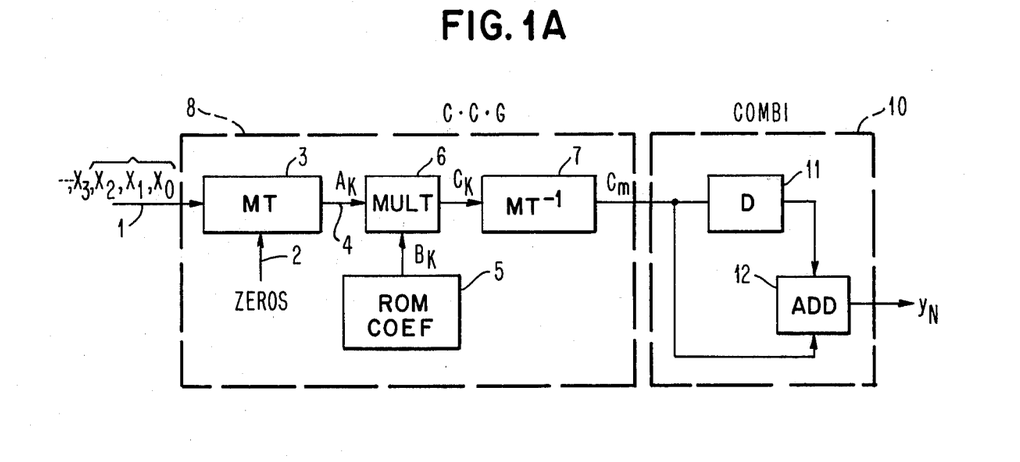
FIGS. 1A and 1B show prior art devices.

(1) First convolution
$[a_n]\ [x_{-1}, x_0, x_1, x_2, x_3]$
$[b_n] = [h_0, h_1, h_2, 0, 0]$
$z_1 = h_0 x_{-1} + h_1 x_3 + h_2 x_2 + 0 x_1 + 0 x_0 = h_0 x_{-1} + h_1 x_3 + h_2 x_2$
$z_2 = h_0 x_0 + h_1 x_{-1} + h_2 x_3 + 0 x_2 + 0 x_1 = h_0 x_0 + h_1 x_{-1} + h_2 x_3$ $z_3 = h_0 x_1 + h_1 x_0 + h_2 x_{-1} + 0 x_3 + 0 x_2 = h_0 x_1 + h_1 x_0 + h_2 x_{-1}$ $z_4 = h_0 x_2 + h_1 x_1 + h_2 x_0 + 0 x_{-1} + 0 x_3 = h_0 x_2 + h_1 x_1 + h_2 x_0$ $z_5 = h_0 x_3 + h_1 x_2 + h_2 x_1 + 0 x_0 + 0 x_{-1} = h_0 x_3 + h_1 x_2 + h_2 x_1$ (2) Second convolution
$[a_n] = [x_2, x_3, x_4, x_5, x_6]$
$[b_n] = [h_0, h_1, h_2, 0, 0]$
$z_6 = h_0 x_2 + h_1 x_6 + h_2 x_5 + 0 x_4 + 0 x_3 = h_0 x_2 + h_1 x_6 + h_2 x_5$
$z_7 = h_0 x_3 + h_1 x_2 + h_2 x_6 + 0 x_5 + 0 x_4 = h_0 x_3 + h_1 x_2 + h_2 x_6$ $z_8 = h_0 x_4 + h_1 x_3 + h_2 x_2 + 0 x_6 + 0 x_5 = h_0 x_4 + h_1 x_3 + h_2 x_2$ $z_9 = h_0 x_5 + h_1 x_4 + h_2 x_3 + 0 x_2 + 0 x_6 = h_0 x_5 + h_1 x_4 + h_2 x_3$ $z_{10} = h_0 x_6 + h_1 x_5 + h_2 x_4 + 0 x_3 + 0 x_2 = h_0 x_6 + h_1 x_5 + h_1 x_4$ 3. The combinations to be made are $Y_1 = z_3 = h_o x_1 + h_1 x_o + h_2 x_{-1}$ $Y_2 = z_4 = h_o x_2 + h_1 + h_2 x_o$ $Y_3 = z_5 = h_o x_3 + h_1 x_2 + h_2 x_1$ $Y_4 = z_8 = h_o x_4 + h_1 x_3 + h_2 x_2$ $Y_5 = z_9 = h_o x_5 + h_1 x_4 + h_2 x_3$ $Y_6 = z_{10} = h_o x_6 + h_1 x_5 + h_2 x_4$ When making use of the Mersenne transforms, a filter embodying the first method can be implemented according to the schematic diagram shown in FIG. 1A. The data on line 1, representing signal samples together with zeros from line 2 appropriately arranged so as to form a series $(a_n)$, are, first, introduced into a Mersenne transformer (MT) 3 which produces on line 4 a sequence of terms:

$$A_K = (\sum_{n=0}^{q-1} a_n \cdot 2^{nk})_{modulo\ p}$$

where $p = 2^q - 1$, with p and q being primes.

When the filter to be implemented is a constant coefficient filter, terms $h_o, h_1, h_2$, are fixed and it is possible to store in a storage 5, a series $[(1/q) \cdot B_K]$ the terms of which result from the application of the Mersenne transform to the series $[b_n] = [h_o, h_1, h_2, O, O]$, followed by the multiplication of the transformed series by a constant coefficient $1/q$. The $A_K$ series on line 4 and $(1/q) \cdot B_K$ series from storage 5 are then sequentially applied to a multiplier (M) 6 which generates the terms of $(1/q) \cdot C_K = (1/9) \cdot A_K \cdot B_K$. By then performing an Inverse Mersenne transform $(MT^{-1})$, upon set $[(1/q) \cdot C_K]$ in transformer 7, terms $c_m$ are obtained, namely:

$$c_m = (\sum_{k=0}^{q-1} C_K \cdot 2^{-mK})_{modulo\ p} = (\sum_{n=0}^{q-1} a_n \cdot b_{(m-n)\ modulo}\ )_{modulo\ p}$$

which result from the circular convolution of $[a_n]$ and $[b_n]$. Therefore, the assembly of transformers 3 and 7, multiplier 6 and ROM storage 5 forms a circular convolution generator (C.C.G) 8. It suffices to add thereto a combination device (COMBl) 10 which combines the results from transformer 7 and which is comprised of a delay unit (D) 11 and an adder 12, to obtain the samples of the filtered signal.

Figure 1B:
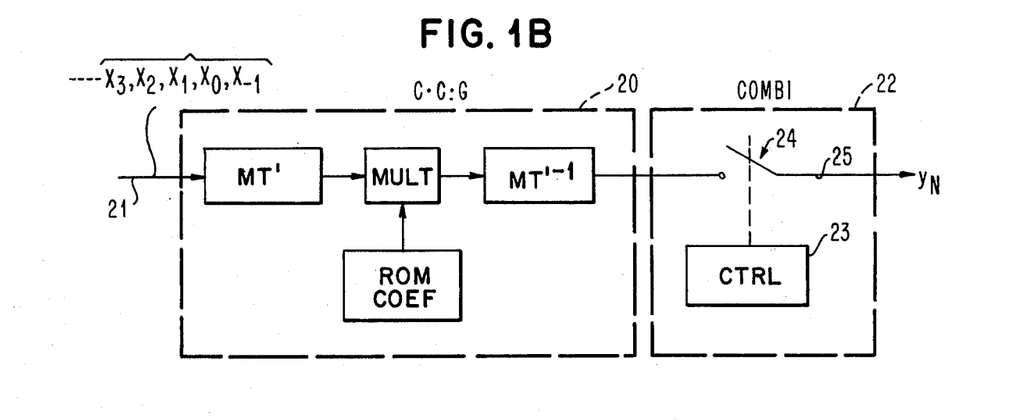

As noted above, the differences between the "overlap-save" method and the "overlap-add" method are in the composition of sequences $[a_n]$ and the combination modes of terms $c_m$ with which it is possible to generate the samples $Y_N$. For this reason the diagram for the "overlap-save" method in FIG. 1B makes use of a circular convolution generator (C.C.G.) 20 similar to the one in FIG. 1A. In this case, however, sample set $[a_n]$ on Line 21 will not include additional zeros; there will be for instance:

$$[a_n] = [x_{-1}, x_o, x_1, x_2, x_3].$$

The combination device 22 will thus have, here, a control element (CTRL) 23 which will activate a switch 24 for selecting the terms coming from generator 20 in order to supply the samples $Y_N$ directly to output 25 without resorting to an addition.

Therefore, with those devices, it is possible to implement a relatively rapid digital filtering operation due to the limited number of multiplications involved in the determination of each sample $Y_N$. However, as mentioned above, there is a close relationship between the number of bits which can be utilized to define a sample $Y_N$ and the number of points on which each Mersenne transform must be performed. The maximum number of usable bits in a transform is equal to $q$. This maximum bit size serves to limit the filter performance.

In the above noted patent application, U.S. Ser. No. 670,325, entitled "Device for Generating Discrete Convolution Function and Digital Filter Embodying said Devices," there is disclosed a technique to divide the number of points of the transform by four without noticeable detriment to both the required computing power and the precision of the obtained result.

In some applications, however, the above solution may affect the size of the filter. This will be remedied by this invention.

To this end, instead of performing a single circular convolution upon each sample set $[a_n]$, two circular convolutions will be performed by the device of this invention. The only restriction is that these transforms should be performed with relative prime numbers as modulos. For simplification purposes, the following description will deal with only two simultaneous transforms.

The first transform is performed modulo $p$, the second one is, modulo $r$. Then, the terms supplied by the two convolutions are added in order to obtain a modulo $p \cdot r$ result with a number of bits which, therefore, can be up to $q+s$. In fact, it can be demonstrated that if the terms resulting from the modulo p convolution and those of the modulo r convolution are designated by $c_m^1$ and $c_m^2$, respectively, the term $c_m$ which would result from a modulo $p \cdot r$ convolution would satisfy the relationship:

$$c_m = [r \, c_m^1 \, (\tfrac{1}{r})_{(modulo \, p)} + p \, c_m^2 \, (\tfrac{1}{p})_{(modulo \, r)}]_{modulo \, p \cdot r} \quad (2)$$

Figure 2:
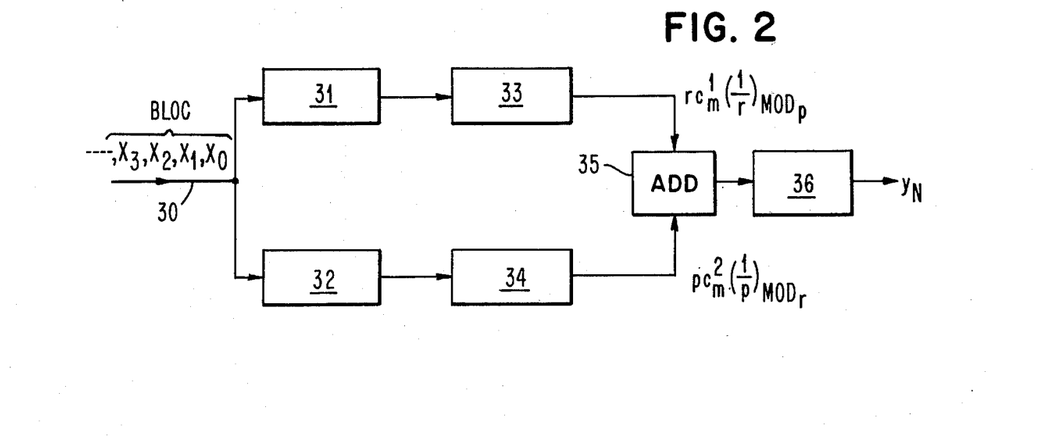
FIG. 2 is a schematic diagram of this invention.

Therefore, the terms $c_m^1$ and $c_m^2$ should be multiplied by the appropriate constant terms before proceeding to the addition thereof. As shown in the diagram of FIG. 2, the flow of samples on Line 30 is split into blocks which are simultaneously sent to first and second circular convolution generators 31 and 32 which operate modulo $p$ and modulo $r$, respectively. A first correction circuit (COR 1) 33 multiplies the terms coming from generator 31 by a constant in order to produce the terms:

$$r \, c_m^1 \, (1/r) \, modulo \, p$$

and a second correction circuit (COR 2) 34 receives the terms coming from generator 32 to produce the terms:

$$(1/p)_{modulo \, r} \, p \, c_m^2$$

The terms coming from correctors 33 and 34 are modulo $p \cdot r$ added in adder 35 which, therefore, produces the terms of $[c_m]$. Then, terms $c_m$ are combined in a combining device 36 of either of the above-mentioned types.

Figure 3:
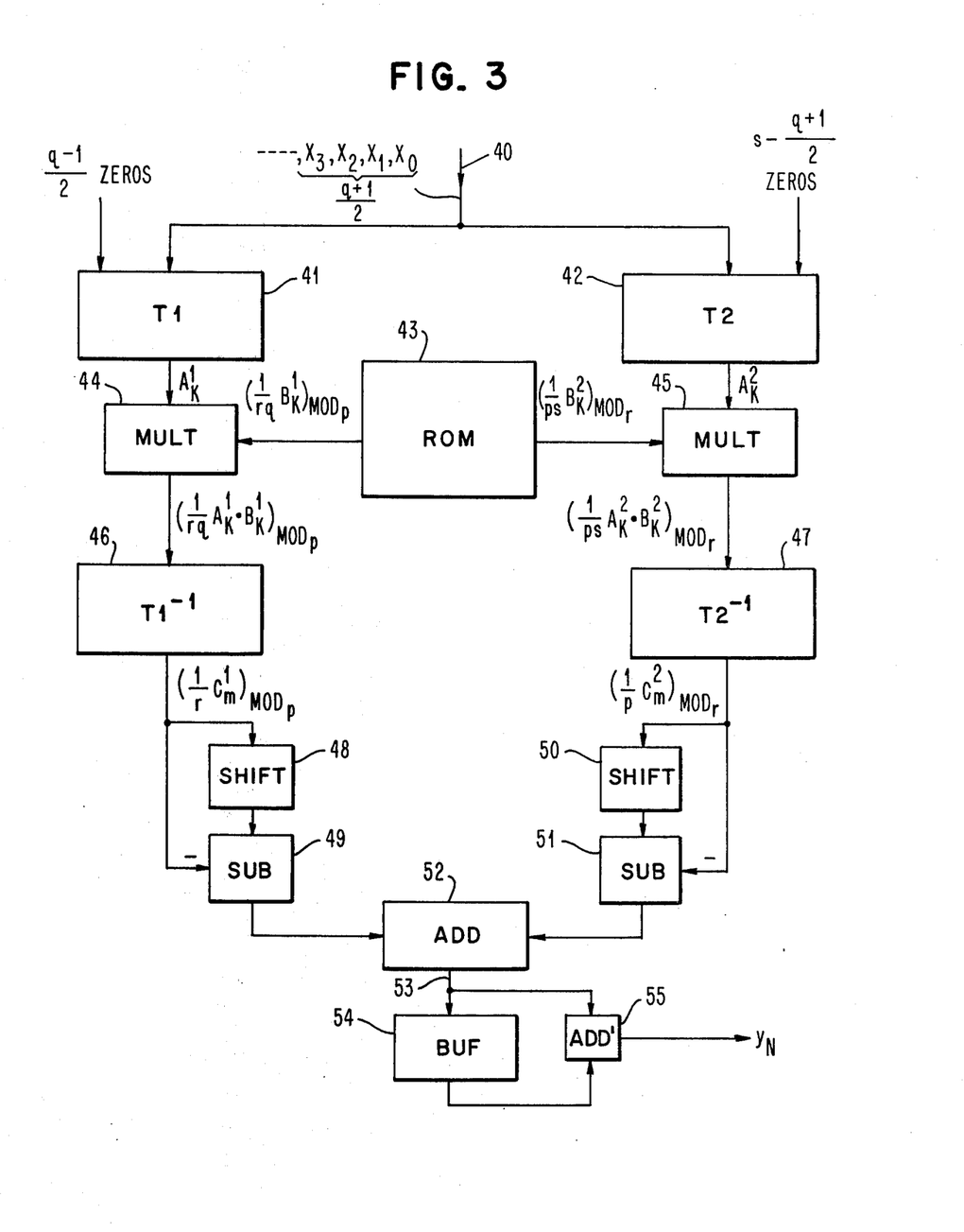
FIGS. 3 and 4 are more detailed schematic diagrams of embodiments according to this invention.

FIG. 3 shows an embodiment of this invention using the "overlap-add" method for conversion of a periodic to an aperiodic function. The flow of input data $x_o, x_1, x_2$, on line 40 ... is split into blocks of $(q+1)/2$ samples simultaneously applied to two Mersenne transformers 41 and 42 (T1 and T2). Transformer 41 deals with $[a_n^1]$ sequences including $(q+1)/2$ samples and $(q-1)/2$ zero terms whereas transformer 42 deals with $[a_n^2]$ sequences including $(q+1)/2$ samples and $s - (q+1)/2$ zero terms. They produce terms:

$$A_k^1 = (\sum_{n=0}^{q-1} a_n^1 \cdot 2^{nK})_{modulo \, p} = (\sum_{n=0}^{\frac{q-1}{2}} a_n 2^{nK})_{modulo \, p}$$

and $$A_k^2 = (\sum_{n=0}^{s-1} a_n^2 \cdot 2^{nK})_{modulo \, r} = (\sum_{n=0}^{\frac{q-1}{2}} a_n 2^{nK})_{modulo \, r}$$

respectively.

Assuming that the required filter has fixed coefficients, the Mersenne transforms $B_K^1$ and $B_K^2$ of series $[b_n^1]$ and $[b_n^2]$ including $(q+1)/2$ coefficients followed by $(q-1)/2$ zeros, and $(q+1)/2$ coefficients followed by $s - (q+1)/2$ zeros, respectively can be permanently stored. Actually, it is advisable to store terms $(1/rq) \, B_K^1)_{modulo \, p}$ and $((1/ps) \, B_K^2)_{modulo \, r}$ in a read only memory (ROM) 43 in order to reduce the number of succeeding operations.

The terms produced by transformers 41 and 42 and the fixed coefficients from ROM 43 are multiplied term-by-term in multipliers 44 and 45. These devices, therefore, produce:

$$C_k^1 = (\tfrac{1}{rq} \cdot A_k^1 \cdot B_k^1)_{modulo \, p}$$

and $$C_k^2 = (\tfrac{1}{ps} \cdot A_k^2 \cdot B_k^2)_{modulo \, r}$$

respectively.

Then, these terms are submitted to inverse Mersenne transforms which are performed modulo p in transformer 46 and are performed modulo r in transformer 47 which transformers, therefore, produce the sequences:

$$((1/r) \, c_m^1)_{modulo \, p}$$
and
$$((1/p) \, c_m^2)_{modulo \, r}$$
respectively.

In order to derive the terms of $(c_m)_{modulo \, p \cdot r}$ as defined by formula (2), the terms produced by transformer 46 must be multiplied by $r = 2^s - 1$. Therefore, the terms are transmitted to both a s-bit position shifter 48 as a delay device and to a subtractor 49 where they are combined with the output of shifter 48. Likewise, the terms produced by transformer 47, which must be multiplied by $p = 2^q - 1$, are delayed in q-bit position shifter 50 and the delayed bits from shifter 50 are combined with those from transformer 47 in a subtractor 51. The outputs of subtractors 49 and 51 are passed to a modulo $p \cdot r$ adder 52. Since the filter of this invention makes use of the "overlap-add" method, the output of adder 52 produces terms z on line 53 which terms must be appropriately combined in order to derive therefrom the samples $Y_N$ of the filtered signal. The latter operation is carried out by means of a buffer 54 acting as a delay circuit and an adder 55.

As can be seen, this invention lends itself particularly well to a parallel word processing, which reduces the hardware necessary for the implementation of the filter. Indeed, if it is desired to obtain $(q+s)$ bit long words, these words are processed in two portions, a first $q$-bit portion and a second $s$-bit portion. As a result some circuits can be saved, more particularly those for the shift operations involved in multiplications by powers of two or in multiplications in the transformed field. In the latter case, each multiplication between $(q+s)$ bit words will be replaced by two simpler multiplications, one dealing with $q$-bit words, and the other one, with $s$-bit words. It should be noted that, in some cases, the precision required of the results, i.e., the number of the bits in the words one wishes to obtain, is different from that which can be obtained directly. Indeed, it can be shown that, for a modulo p transform, the number of the bits is equal to $q$. Now, the Mersenne transforms exist only for the p and q primes, i.e., $q$ must be chosen from amongst the following values:

$$q = 2, 3, 5, 7, 13, 17, 19, 31, 61, 89, 107, 127, 521, 607,$$
$$1279, 2203, \ldots$$

If it is assumed that the required precision is 36 bits, 61-bit words must be operated upon when making use of the known methods, since there are no possible $q$ values between 31 and 61. With this invention, it is possible to operate upon two words, one of seventeen bits ($q=17$) and the other of nineteen bits ($s=19$).

In practice, it is advisable to choose $q$ and $s$ with as small a difference as possible between them. The following description will disclose an embodiment of the invention where $q=5$ and $s=7$. The corresponding Mersenne transforms are:

$$A_0^1 = (a_o + a_1 + a_2)_{modulo\,p}$$

$$A_1^1 = (a_o + a_1 2 + a_2 2^2)_{modulo\,p}$$

$$A_2^1 = (a_o + a_1 2^2 + a_2 2^4)_{modulo\,p}$$

$$A_3^1 = (a_o + a_1 2^3 + a_2 2)_{modulo\,p}$$

$$A_4^1 = (a_o + a_1 2^4 + a_2 2^3)_{modulo\,p}$$

$$A_0^2 = (a_o + a_1 + a_2)_{modulo\,r}$$

$$A_1^2 = (a_o + a_1 2 + a_2 2^2)_{modulo\,r}$$

$$A_2^2 = (a_o + a_1 2^2 + a_2 2^4)_{modulo\,r}$$

$$A_3^2 = (a_o + a_1 2^3 + a_2 2^6)_{modulo\,r}$$

$$A_4^2 = (a_o + a_1 2^4 + a_2 2)_{modulo\,r}$$

$$A_5^2 = (a_o + a_1 2^5 + a_2 2^3)_{modulo\,r}$$

$$A_6^2 = (a_o + a_1 2^6 + a_2 2^5)_{modulo\,r}$$

As indicated in FIG. 3, the device according to this invention is comprised of two identical portions working in parallel. In addition, when choosing q and s so that there is only a small difference between them, the operating times of the corresponding element in the two portions will be essentially the same. It is, therefore, possible to save circuits by operating on a time-sharing basis so that the functions necessary for each of the circuit portions can be alternated in a single circuit.

Figure 4:
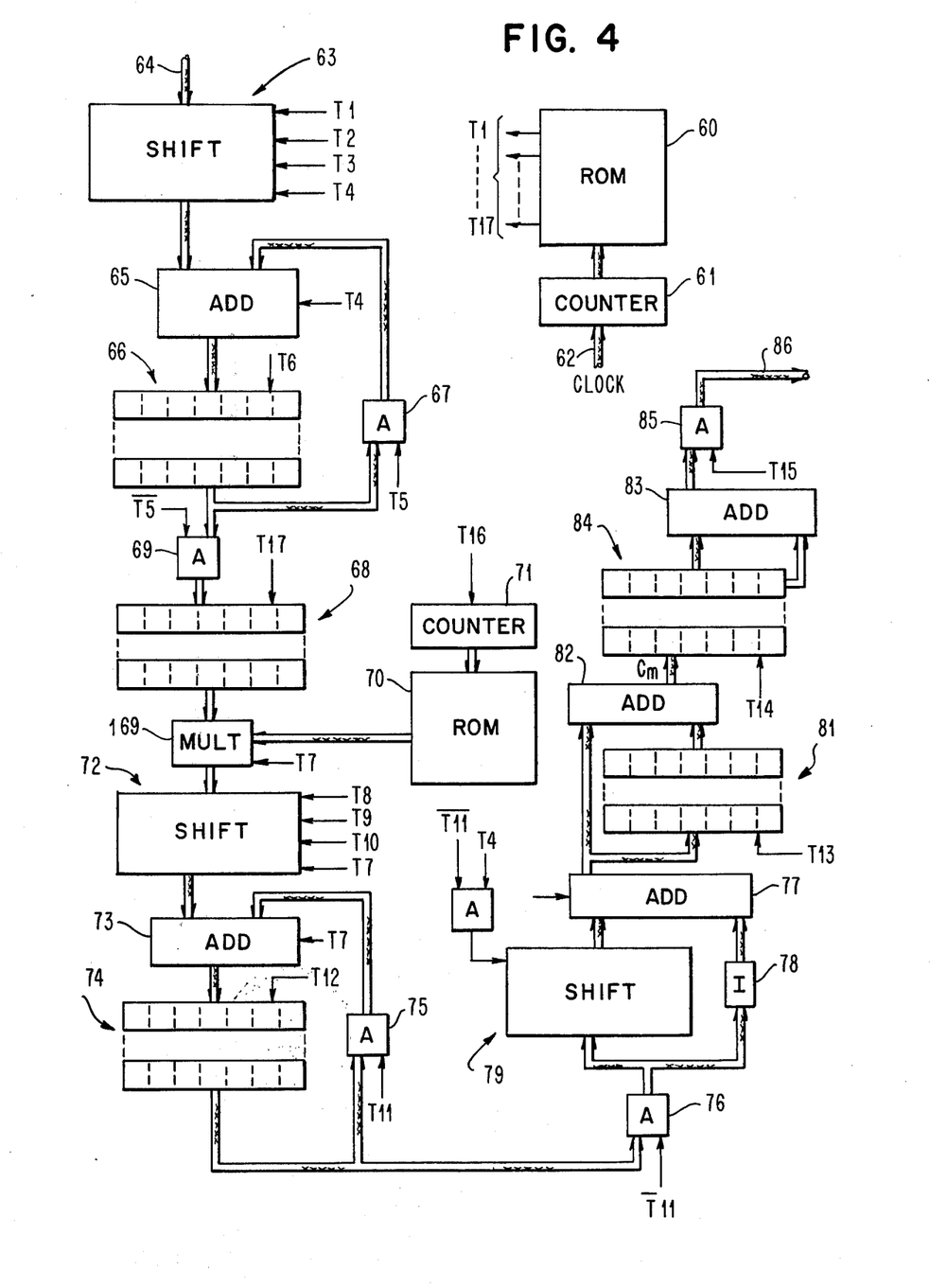
Figure 6:
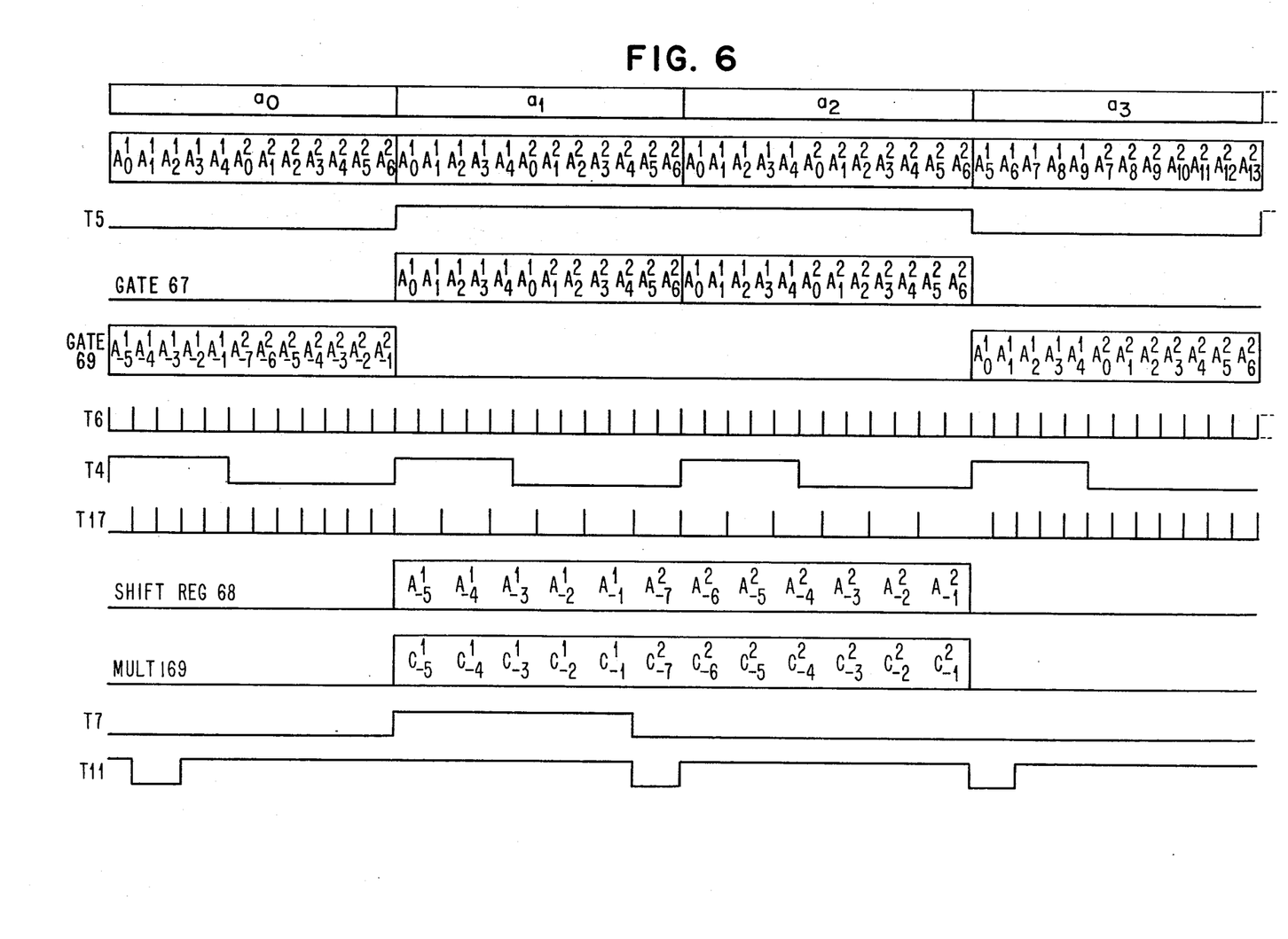
FIG. 6 is a time diagram illustrating some operations carried out by the device shown in FIG. 4.

Specifically, this will lead to the embodiment shown in FIG. 4. The operation of this filter will be as shown in the timing diagram of FIG. 6. The device is controlled by a ROM 60 which produces combinations of pulses on timing lines T1 to T17 for the timing of the operations and is under the control of a 36 pulse counter 61 fed with regularly spaced clock pulses on line 62. The filter includes a shift circuit 63 which is controlled by lines T1, T2, T3 and T4 and which receives on line 64 the samples of the signal to be filtered, with the signals to be split into three-sample blocks. A first sample $a_o$, see the top line of FIG. 6, is transmitted into adder 65 under control of time line T4 and then is sent for each of 12 clock pulse times T6 into a 12 position, 7-bit wide, shift register 66 which is shifted at each pulse on line T6. A feedback loop from the output of register 66 back to the second input of adder 65 by way of a gate 67 is open at the time T5, see FIG. 6. With this circuit, it is possible to send the value of sample $a_o$ into all positions of the twelve-word register 66 that will store terms $A_K^1$ and $A_K^2$ when being created as indicated in the second line of FIG. 6. The samples will be modulo p for the first five entries as shown by the positive level of T4 and will be modulo r for the remaining entries. Since there is to be no weighting while $a_o$ is being entered into shift register 66 for the partial generation of these terms, when this first sample occurs, shift control lines T1, T2 and T3 are not operated, thereby imparting no shift to the bits in $a_o$ which will pass through adder 65 unchanged. It is only during the first five clock cycles that $a_o$ is sent into the terms $A_K^1$ through adder 65 then operating modulo p under the control of the up level of line T4. During the seven following clock cycles, $a_o$ is sent into the terms of $A_K^2$ via adder 65 then operating modulo r under the control of the down level of T4. After twelve cycles of T6, the sample $a_o$ has been entered into all of the $A_K^1$ and $A_K^2$ registers of 66. The following sample, namely $a_1$, is then sent to the input of shifter 63 where it is multiplied by the necessary power of two, see the above table, when lines T1, T2 and/or T3 assume logic state "one" during the next 12 cycles. The multiplications are modulo p or modulo r as controlled by the level of line T4. The details concerning the shift operation of circuits 63 will be given at a later point. The appropriately weighted term $a_1$ is then added in adder 65 to the $a_o$ term stored in the corresponding memory position of shift register 66 and gated back to adder 65 by a signal on line T5 to gate 67. The same procedure is repeated during the third 12 cycles with term $a_2$. At the end of the 36th cycle of T6, all of the $A_K^1$ and $A_K^2$ terms are available in shift register 66. They are entered into a second assembly of 12 seven-bit shift registers 68 which can also accommodate twelve words, through gates 69 which are open under control of the down level of line T5 when the next term $a_3$ is being entered into the top of shift register 66. While the computation of the Mersenne transforms of the following data block of three samples, namely $a_3$, $a_4$, and $a_5$ is proceeding during entry of $a_4$ and $a_5$, the $A_K^1$ and $A_K^2$ terms from the previous transform and now in shift register 68 are multiplied in multiplier 169 by terms $(1/rq)$ $B_K^1$ and $(1/ps)$ $B_K^2$. These operations are carried out alternately modulo p for five terms or modulo r for seven terms according to the level of the T7 signal (see FIG. 6). The $(1/rq)$ $B_K^1$ and $(1/ps)$ $B_K^2$ terms resulting from the transforms of the filter coefficients, which are assumed to be fixed, are read from a ROM 70 under control of a counter 71 operated by the timing pulses T16. The structure which is utilized to generate the inverse transforms of the terms supplied by multiplier 169 is in all respects similar to the structure (shifter 63, adder 65, shift registers 66, gate 67 and gate 69) which generates the terms of the direct transforms. It is comprised of shift circuit 72, adder 73, five-word position shift register 74 and gates 75 and 76. Its detailed description is believed unnecessary. The output terms passing through gate 76 at T11 time are then transmitted to an adder 77 through an inverter 78 and a shift circuit 79. Shifter 79 imparts a shift of s positions to the terms applied thereto so long as the term (T4· $\overline{T11}$) is at a low logic level and a shift of q bit positions while (T4· $\overline{T11}$) is at a high logic level. The shift results in a multiplication of the terms coming from shift register 74 either by $2^s$ or by $2^q$. After the addition, allowing for the inversion effected by the inverter 78, adder 77 produces $r \cdot c_m^1 (1/r)_{modulo\,p}$ and $p \cdot c_m^2 (1/p)_{modulo\,r}$ The term $r \cdot c_m^1 (1/r)_{modulo\,p}$ is delayed by five-position shift register 81 before it is added to the term $p \cdot c_m^2 (1/p)_{modulo\,r}$ by adder 82 which, therefore, supplies terms $c_m$. These terms $c_m$ are transmitted to adder 83 through a ten position shift register 84 which has an output tap at the fifth word level. The adder 83 will add the two terms $c_{mx}$ and $c_m(x+5)$ to produce the same samples of the filtered signal. Finally, these samples of the filtered signal are passed to an output line 86 through gate 85 which is conditioned at time T15.

Figures 5, 5B:
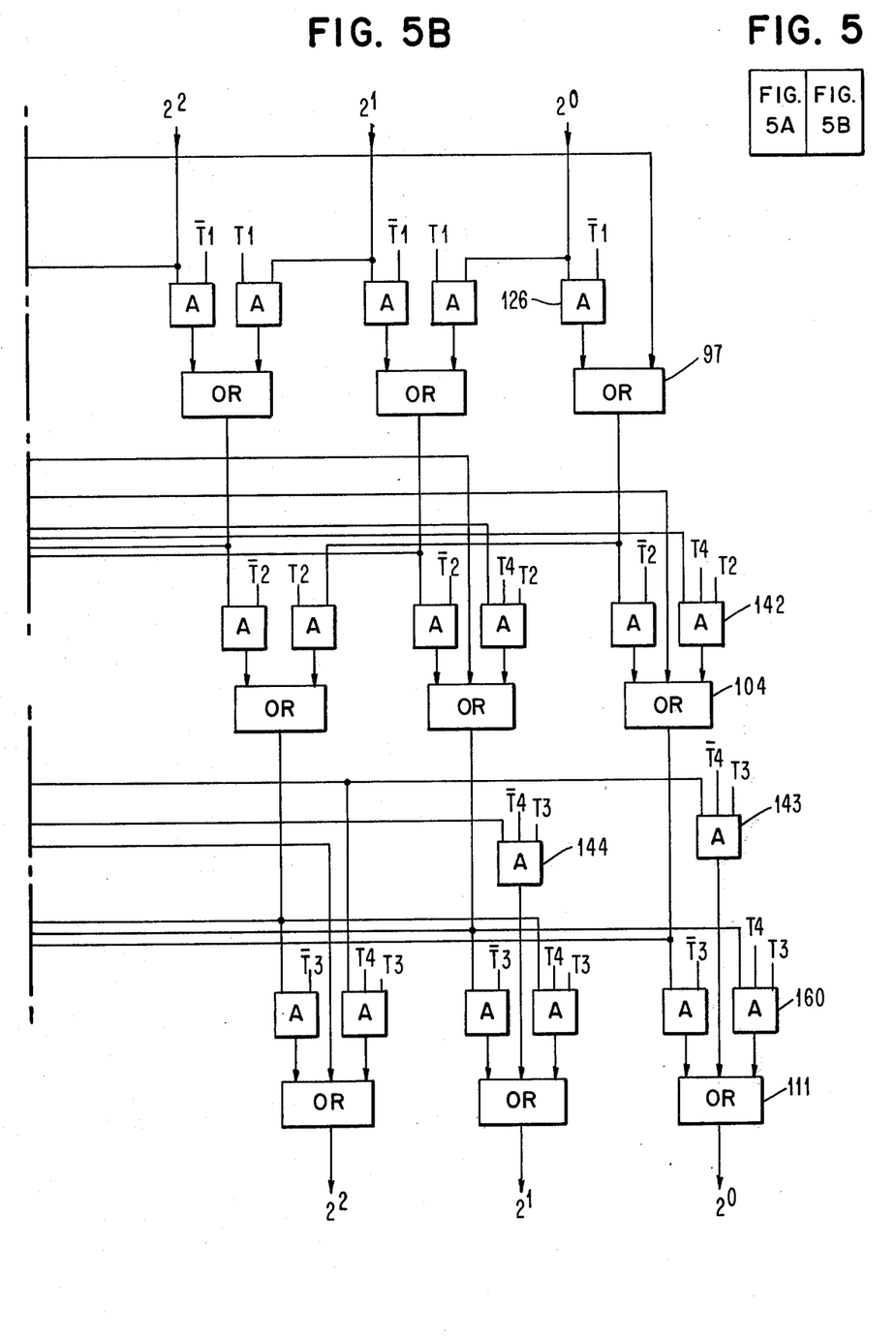
FIGS. 5, 5A and 5B in combination show in detail an element of FIG. 4.
Figure 5A:
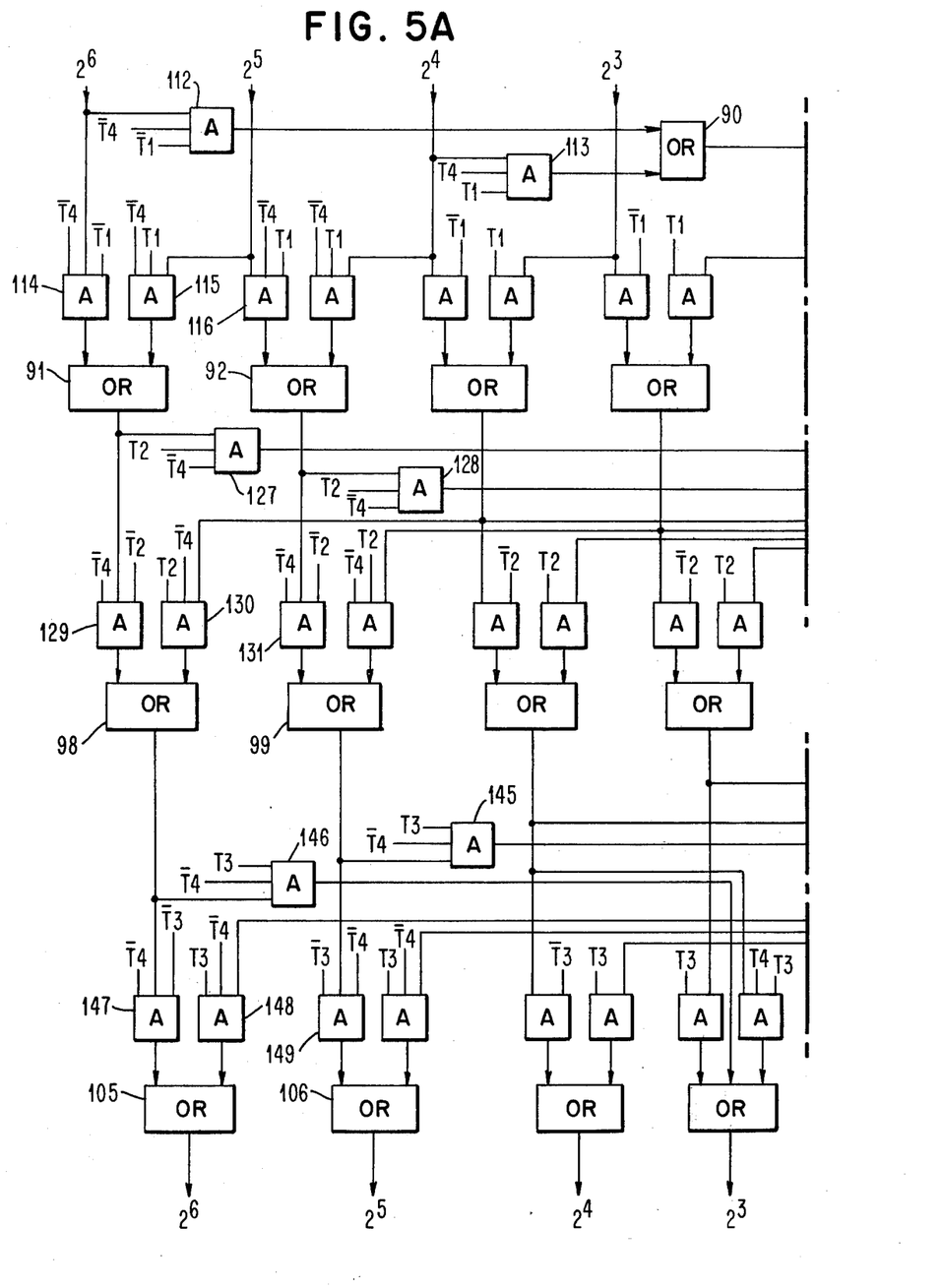

The details for the implementation of shift circuits 63 and 72 are shown in FIG. 5. It should be noted that this figure is comprised of logic OR circuits and AND gates referenced as ORs 90 through 111 and AND gates 112 through 160, respectively. This schematic diagram is largely repetitive and, therefore, it will be only briefly described. The circuit can produce modulo 5 or modulo 7 left shifts of from 0 to 7 bit positions by the use of similar cascade-mounted stages. The bits in the input words are applied to inputs $2^0$ through $2^6$, according to their weights. The first stage comprised of AND circuits 112 through 126 and OR circuits 91 through 97 imparts to the input bits of this word either no shift or a left shift of one bit position depending on whether the signal T1 is at a "zero" or a "one" logic level. The second stage is comprised of AND circuits 127 through 142 and OR circuits 98 through 104 and provides the facility of either no shift or a modulo 5 or modulo 7 leftward two-bit position shift depending on whether the signal T2 is at a "zero" or a "one" level. Finally, the third stage comprised of AND circuits 143 through 160 and OR circuits 105 through 111 imparts no shift or a four-bit position modulo 5 or modulo 7 shift according to the level of T3. Each of said stages will shift modulo 5 or modulo 7 according to the logic level of T4. It may be noted that for the second and third shift levels, some bits may be shifted past the left end of the output OR's. These bits are reintroduced into the right-hand OR's by the AND's 127, 128, and 143 to 146 as indicated.

FIG. 6 shows the progression of the operations with respect to time. The first line is indicative of how long the terms $a_0, a_1, a_2, a_3, \ldots$, are present at the input 64 of the filter. The second line is indicative of the term of the transform being processed, at the input of shift register 66. The third line is indicative of the levels of signal T5. The fourth and fifth lines are indicative of the data terms coming from gates 67 and 69, respectively. The sixth, seventh and eighth lines are representative of signals T6, T4 and T17, respectively. The ninth and tenth lines are indicative of the terms appearing at the outputs of shift register 68 and mulitplier 169, respectively. Finally, signals T7 and T11 are represented on the last two lines, respectively.

It is clear from the above description that this invention does not depend on the type of the circular convolution generator used for a transform. For instance, one can make use of the device disclosed in the above-mentioned patent application, Ser. No. 670,325. In such use, the Mersenne transforms and their inverses involved in the filter of this invention, will be effected upon about one quarter of the points (namely $(q+1/4)$ and $(s+1/4)$ and then extended to $q$ and $s$ points. In that case, each of the portions (transformer 41, multiplier 44, and inverse transformer 46 and transformer 42, multiplier 45 and inverse transformer 47) shown in the appended FIG. 3 could be replaced by the device shown in FIG. 2 of the cited patent application.

It is to be understood that the preceding description has been given only as a preferred embodiment and that numerous alternations and substitutions may be made without departing from the spirit and scope of this invention as set out in the following claims.

What is claimed is:

1. A digital filter for a series of samples of a signal, said filter characterized in that it includes:
    an input to which the samples of the signal to be filtered are applied;
    an input control means for separating said samples into data blocks of a fixed length;
    at least two different circular convolution generators, each having an input receiving each of said data blocks and generating the terms resulting from the circular convolution of the samples of each said block with an associated block of coefficients defining the required filtering operation of the generator;
    a product means for each circular convolution generator for multiplying the output of the associated one of said generators by a correcting term specific to the attached generator;
    an adder for adding together the corresponding terms in the outputs of said two product means; and
    a means for combining selected ones of the terms supplied by said adder to produce a series of samples representing the filtered signal.

2. A digital filter for a series of digitally represented samples of a signal, said filter characterized in that it includes:
    an input to which said digitally represented samples of the signal to be filtered are applied;
    a control means for separating said digital samples into data blocks of a fixed length;
    at least two different circular convolution generators, each having an input receiving each of said data blocks and generating the terms resulting from the circular convolution of each of said blocks when expanded with a sequence of a fixed number of zero terms, with an associated similar sized block of coefficients expanded with the same sequence of a fixed number of zero terms and defining the required filtering operation;

a product means for each convolution generator for multiplying the output of the associated one of said generators by a correcting term specific to the attached generator;

an adder means for adding together corresponding terms in the outputs of said product means; and a means for sequentially generating digital representations of samples of a filtered signal by adding together selected ones of the terms in the output of said adder means which terms result from the processing of two consecutive input data blocks.

3. A digital filter as in claim 2 further characterized in that each of said two circular convolution generators is comprised of:

a Mersenne transform generator operating upon the blocks of digital values wherein each digital value is representative of a sample of the signal to be filtered;

a memory containing the Mersenne transforms of the coefficients of the desired filter function of the convolution generator with each coefficient being multiplied by a constant factor;

a multiplier means for receiving the terms of data and coefficient transforms from said generator and said memory to generate term-by-term products of said transforms; and means receiving said product terms for effecting the inverse Mersenne transform of the terms supplied by said multiplier.

4. A digital filter for a series of samples of a signal to be filtered, said filter characterized in that it includes:

an input to which said samples of the signal to be filtered are sequentially applied;

a control means for sequentially splitting the flow of said samples into data blocks of a fixed length;

at least two different circular convolution generators, each generator having an input receiving each of said data blocks and generating the terms resulting from the circular convolution of said received blocks with an associated block of filter coefficients expanded to a given length with a sequence of zero terms;

a product means for each generator for multiplying each of the output terms of each of said generators by a correcting term specific to said generator;

a summing means for addition of corresponding terms in the outputs of said product means; and an output means for sequentially generating digital representations of samples of the desired filtered signal by selecting some of the terms supplied by said summing means.

5. A digital filter for a series of digitally represented samples of a signal, said filter characterized in that it includes:

an input to which the digital representations of the samples of the signal to be filtered are sequentially applied;

a control means for sequentially separating said representations of said samples into data blocks with a fixed number of samples in each data block;

a first circular convolution generator performing a data converting operation according to the Mersenne transform and generating output terms to a prime number ($p$) modulo;

a second circular convolution generator also operating according to the Mersenne transform to generate output terms to a second prime number ($r$) modulo;

a data transfer means for simultaneously applying each of said data blocks to said first and second generators;

a product means for each generator, each product means multiplying the output of the associated one of said generators by a correcting term specific to the associated generator and supplying its product terms to the modulo of its associated generator;

a summing means for term-by-term addition, modulo $p \cdot r$, of the corresponding terms supplied by said two product means; and an output means for generating digital representations of samples of the desired filtered signal by combining the terms supplied by said summing means.

6. A digital filter for a series of representaions of samples of a signal to be filtered, said filter characterized in that it includes:

an input to which the representations of samples of the signal to be filtered are sequentially applied;

control means for sequentially separating said series of samples into blocks of $(q+1/2)$ samples, $q$ being a prime number;

a first device for generating the terms of a Mersenne transform;

means for introducing each of said data blocks into said first device for generating the terms of the Mersenne transform $A_K^1$ modulo $p$, of each of said data blocks wherein each of said data blocks has appended thereto a series of $(q-1/2)$ zero terms, where $p$ is a prime number equal to $2^q - 1$;

a second device for generating the terms of a Mersenne transform;

another means for introducing each of said data blocks into said second device for generating the Mersenne transform $A_K^2$, modulo $r$, of each of said data blocks wherein each block has appended thereto a series of $(s - (q+1/2))$ zero terms, where $r$ is a prime number equal to $2^s - 1$;

a memory containing the sets of terms $((1/rq) \ B_K^1)_{modulo \ p}$ and $((1/ps) \ B_K^2)_{modulo \ r}$ which terms represent the coefficients of a desired filtering operation expanded with $(q-1/2)$ and $s - (q+1/2)$ zero terms, respectively;

a first means for multiplying, modulo $p$, the terms $A_K^1$ from said first Mersenne transform device by the corresponding terms of the set of terms $((1/rq) \ B_K^1)_{modulo \ p}$ a second means for multiplying, modulo $r$, the terms $A_K^2$ from said second Mersenne transform device by the corresponding terms of the set of terms $((1/ps) \ B_K^2)_{modulo \ r}$ a third means for generating, modulo $p$, the terms of the inverse Mersenne transform of each of the output terms from said first multiplying means;

a fourth means for generating, modulo $r$, the terms of the inverse Mersenne transform of each of the output terms from said second multiplying means;

a pair of delay means, one for each of said third and fourth means, to buffer for s and q sample times, respectively, the output terms supplied by said third and fourth means;

a first subtraction means for subtracting the terms supplied by said third means from those which have been buffered for s sample times;

a second subtraction means for subtracting the terms supplied by said fourth means from those which have been buffered for q sample times;

a summer for adding, modulo p.r, the corresponding terms supplied by said first and second subtraction means; and means for adding consecutive ones of the terms resulting from the addition modulo p.r in said summer to generate output terms representing samples of a desired filtered signal.

7. A digital filter for a series of samples of a signal, said filter characterized in that it includes:

an input to which the samples of the signal to be filtered are sequentially applied;

a control means for separating said series of samples into data blocks of a fixed length;

a circular convolution generator having an inut receiving each of said data blocks and generating representations of the terms resulting from circular convolutions between the samples in each data block and a block of coefficients defining the desired filtering operation;

timing means for utilizing said circular convolution generator at least two consecutive times for each of said data blocks;

a product means for multiplying each term in the output of said circular convolution generator by an associated correcting term;

a summing means for adding each output term supplied by said product means to a delayed previously generated term; and an output means for combining consecutive terms in the output of said summing means to generate a sequence of terms representing a series of samples of the desired filtered signal.

* * * * *